(12) United States Patent
Hayashi et al.

(10) Patent No.: US 8,227,067 B2
(45) Date of Patent: Jul. 24, 2012

(54) OPTICAL RECORDING MEDIUM, AND SPUTTERING TARGET AND METHOD FOR PRODUCING THE SAME

(75) Inventors: Yoshitaka Hayashi, Yokohama (JP); Noboru Sasa, Kawasaki (JP); Toshishige Fujii, Yokohama (JP); Masayuki Fujiwara, Kawasaki (JP); Toshihide Sasaki, Yokohama (JP); Masaki Kato, Machida (JP); Masataka Mohri, Atsugi (JP); Katsuyuki Yamada, Zama (JP)

(73) Assignee: Ricoh Company, Ltd., Tokyo (JP)

( * ) Notice: Subject to any disclaimer, the term of this patent is extended or adjusted under 35 U.S.C. 154(b) by 232 days.

(21) Appl. No.: 12/524,609

(22) PCT Filed: Jan. 28, 2008

(86) PCT No.: PCT/JP2008/051699
§ 371 (c)(1),
(2), (4) Date: Jul. 27, 2009

(87) PCT Pub. No.: WO2008/099692
PCT Pub. Date: Aug. 21, 2008

(65) Prior Publication Data
US 2010/0003446 A1  Jan. 7, 2010

(30) Foreign Application Priority Data

Jan. 30, 2007 (JP) ................................ 2007-019902
Aug. 1, 2007 (JP) ................................ 2007-200927

(51) Int. Cl.
*B32B 3/02* (2006.01)

(52) U.S. Cl. .................. 428/64.1; 428/64.4; 430/270.12
(58) Field of Classification Search ................. 428/64.1, 428/64.4; 430/270.12
See application file for complete search history.

(56) References Cited

U.S. PATENT DOCUMENTS

| | | |
|---|---|---|
| 6,933,032 B2 | 8/2005 | Sasa et al. |
| 7,413,788 B2 | 8/2008 | Sasa et al. |
| 7,488,526 B2 | 2/2009 | Hayashi et al. |
| 2006/0222810 A1 | 10/2006 | Hayashi et al. |
| 2007/0053786 A1 | 3/2007 | Nonaka et al. |
| 2007/0218239 A1* | 9/2007 | Hayashi et al. ............. 428/64.4 |
| 2007/0237064 A1 | 10/2007 | Fujii et al. |
| 2008/0138563 A1* | 6/2008 | Shibata et al. ................. 428/98 |

FOREIGN PATENT DOCUMENTS

| | | |
|---|---|---|
| JP | 2003-48375 | 2/2003 |
| JP | 2005-108396 | 4/2005 |
| JP | 2005-117031 | 4/2005 |
| JP | 2005-161831 | 6/2005 |
| JP | 2005-264206 | 9/2005 |
| JP | 2006-116948 | 5/2006 |
| JP | 3802040 | 5/2006 |
| JP | 2006-247897 | 9/2006 |
| JP | 2007-261247 | 10/2007 |
| JP | 2008-41169 | 2/2008 |
| WO | WO2006/025558 A1 | 3/2006 |

* cited by examiner

*Primary Examiner* — Elizabeth Mulvaney
(74) *Attorney, Agent, or Firm* — Cooper & Dunham LLP

(57) ABSTRACT

An optical recording medium containing a substrate and a recording layer over the substrate, wherein the recording layer primarily contains Bi and O, and further contains B and at least one element X selected from Ge, Li, Sn, Cu, Fe, Pd, Zn, Mg, Nd, Mn and Ni, and a sputtering target containing Bi, B and at least one element X selected from Ge, Li, Sn, Cu, Fe, Pd, Zn, Mg, Nd, Mn and Ni.

20 Claims, 4 Drawing Sheets

OPTICAL RECORDING MEDIUM, AND SPUTTERING TARGET AND METHOD FOR PRODUCING THE SAME

TECHNICAL FIELD

This disclosure relates to a write-once-read-many (WORM) optical recording medium enables to be recorded at high density with high sensitivity over a wavelength range for blue laser, and specifically relates to a write-once-read-many optical recording medium for high recording sensitivity and high linear velocity recording, and a sputtering target for forming an oxide containing-recording layer in the optical recording medium, and a method for producing the sputtering target.

BACKGROUND ART

In order to provide optical recording media which enable to be recorded and reproduced over a blue laser wavelength range or shorter wavelength range, blue laser beams enabling ultra-high density recording have been rapidly developed along with development of a recordable optical recording media to which such blue laser beams can be used.

The inventors of the present invention propose the availability of an optical recording media having a recording layer which primarily contains a metal oxide or a half metal oxide, particularly bismuth oxide (Patent Literatures 1 to 4) as write-once-read-many optical recording media enabling to be recorded at high density over a wavelength range for blue laser. In Patent Literature 5 and the like, the applicant of the present invention proposes that a write-once-read-many optical recording medium having a Bi—B—O (oxygen) containing-recording layer exhibits still better properties (hereinafter, a technology relating to these application are referred to as "applicant's conventional technologies").

In the applicant's conventional technologies, the write-once-read-many optical recording media have been confirmed to have excellent recording and reproducing property.

Besides the above-described applicant's conventional technologies, Patent Literature 6 discloses an optical recording medium having a recording layer which primarily contains bismuth oxide, but does not contain B.

Optical discs have been developed on high density recording and speeding up of recording. In conventional DVD high density has been achieved by providing two layers, and optical discs recordable at 16× are available in terms of speeding up of recording. Optical discs using a blue laser diode may also be developed for high velocity recording. Thus, optical recording media for high velocity recording are beginning to be developed.

However, high velocity recording has not been considered in the applicant's conventional technologies. Patent Literature 6 has an object to improve recording and reproducing property and reliability (reproduction stability and storage stability), and a material in which various elements X are added to bismuth oxide is considered. However, in all Examples one element X is added to the bismuth oxide and does not contain B, and specific examples of materials in which two or more of the elements X are added to the bismuth oxide are not disclosed.

The sputtering method has been widely known as one of the vapor-phase deposition techniques for producing a thin layer. The method is also used in an industrial thin layer production. In the sputtering method, a target material which has the same component as a layer to be formed is prepared. Normally, argon gas ion which is generated by means of glow discharge in the target material is then allowed to collide with this target material with the result that the constituent atoms of the target material are hammered out, and atoms are accumulated on the substrate thereby forming a layer. In particular, since oxides generally have high melting points, a method such as vapor deposition is not preferably used and thus a radio frequency sputtering that applies a high frequency is often used. The sputtering method has achieved satisfactory results in the production process and is advantageous in a point of through-put. However, in the case where a layer made of a material containing two or more elements is deposited, the resultant layer often has a different composition from its sputtering target, thus the composition of the target has to be considered. Furthermore, the structure and the quality of the layer often differ depending on the form of the compound making up the target; thus, it is also necessary to consider the form of the compound.

Furthermore, it is also required to further improve a layer deposition rate from the viewpoint of the production cost. For improvement of the layer deposition rate, it is necessary to introduce larger power. In this case as well, it is necessary to improve the target strength so as to avoid breaking of the target.

For example, Patent Literature 7 discloses a $Bi_2O_3$-based glass-like target containing $B_2O_3$. However, the glass-like target in Patent Literature 7 inevitably contains $SiO_2$ and is different in components from the target of the present invention.

Optical recording requires high density recording as well as high linear velocity recording to improve information transfer speed. High linear velocity recording needs higher recording sensitivity than low linear velocity recording. However, the applicant's conventional technologies have not been limited on recording linear velocity, and may not be suitable for high linear velocity recording.

The form and structure of a compound and impurities making up a sputtering target for a recording layer affects a composition and crystal structure of the recording layer to be formed. Therefore, the compounds making up the sputtering target is made suitable for properties of a desired recording layer.

Patent Literature 1: Japanese Patent Application Laid-Open (JP-A) No. 2003-48375
Patent Literature 2: JP-A No. 2005-161831
Patent Literature 3: JP-A No. 2005-108396
Patent Literature 4: JP-A No. 2006-116948
Patent Literature 5: JP-A No. 2006-247897
Patent Literature 6: Japanese Patent (JP-B) No. 3802040
Patent Literature 7: JP-A No. 2005-264206

SUMMARY

In an aspect of this disclosure, there is provided a write-once-read-many optical recording medium having high sensitivity and suitable for high linear velocity recording, and a sputtering target having high packing density and high productivity and high strength during layer formation, capable of improving layer deposition rate and suitable for producing the write-once-read-many optical recording medium, and a method for producing the sputtering target.

The inventors have already devised a write-once-read-many optical recording medium having a recording layer which primarily contains Bi, B and O (oxygen) as described above. However they have diligently conducted experiments to further improve sensitivity and linear velocity recording property, by adding at least one element X selected from Ge, Li, Sn, Cu, Fe, Pd, Zn, Mg, Nd, Mn, and Ni to Bi, B and O (oxygen) so as to control changes in the oxygen binding state and changes in optical absorption efficiency.

Various other aspects and features and can included, such as, for example, the following:

<1> An optical recording medium containing a substrate and a recording layer over the substrate, wherein the recording layer primarily contains Bi and O, and further contains B and at least one element X selected from Ge, Li, Sn, Cu, Fe, Pd, Zn, Mg, Nd, Mn and Ni.

<2> The optical recording medium according to <1>, wherein the recording layer contains Bi, B, O and Ge.

<3> The optical recording medium according to <1>, wherein the recording layer contains Bi, B, O and Sn.

<4> The optical recording medium according to any one of <1> to <3>, further containing a first protective layer and a second protective layer, wherein the first protective layer is disposed on one surface of the recording layer and the second protective layer is disposed on the other surface of the recording layer.

<5> The optical recording medium according to <4>, wherein each of the first protective layer and the second protective layer contains a sulfide, oxide, nitride, carbide or composite thereof.

<6> The optical recording medium according to any one of <4> to <5>, wherein at least one of the first protective layer and the second protective layer contains the sulfide.

<7> The optical recording medium according to <6>, wherein at least one of the first protective layer and the second protective layer contains ZnS and $SiO_2$.

<8> The optical recording medium according to any one of <6> and <7>, wherein at least a reflective layer, the first protective layer, the recording layer, and the second protective layer, and a cover layer are disposed over the substrate in this order.

<9> The optical recording medium according to any one of <6> and <7>, wherein at least the second protective layer, the recording layer, the first protective layer and a reflective layer are disposed over the substrate in this order.

<10> A sputtering target containing Bi, B and at least one element X selected from Ge, Li, Sn, Cu, Fe, Pd, Zn, Mg, Nd, Mn and Ni.

<11> The sputtering target according to <10>, further containing O, wherein the sputtering target primarily contains Bi and O.

<12> The sputtering target according to <11>, wherein the sputtering target contains Bi, B, O and Ge.

<13> The sputtering target according to <11>, wherein the sputtering target contains Bi, B, O and Sn.

<14> The sputtering target according to any one of <11> to <13>, wherein the sputtering target contains a composite oxide of Bi and B.

<15> The sputtering target according to any one of <11> to <14>, wherein the sputtering target contains a composite oxide of Bi and the element X.

<16> The sputtering target according to <15>, wherein the sputtering target contains $Bi_{12}GeO_{20}$.

<17> The sputtering target according to any one of <11> to <16>, wherein the sputtering target contains Bi and O, and further contains B and at least one element X selected from Ge, Li, Sn, Cu, Fe, Pd, Zn, Mg, Nd, Mn and Ni, which are contained as an oxide, and the oxide contains oxygen smaller than the stoichiometric composition.

<18> The sputtering target according to any one of <10> to <17>, wherein the sputtering target has a packing density of 75% to 99%.

<19> A method for producing the sputtering target according to any one of <10> to <18> including mixing, pulverizing and granulating a powder of $Bi_2O_3$, a powder of $B_2O_3$ and a powder of at least one element X selected from Ge, Li, Sn, Cu, Fe, Pd, Zn, Mg, Nd, Mn and Ni in a condition that they are free from water absorption so as to form granulated powders, and sintering the granulated powders by heating and pressing.

<20> A method for producing the sputtering target according to any one of <10> to <18> including mixing a powder of $Bi_2O_3$, a powder of $B_2O_3$ and a powder of at least one element X selected from Ge, Li, Sn, Cu, Fe, Pd, Zn, Mg, Nd, Mn and Ni in a condition that they are free from water absorption so as to form mixed powders; pulverizing and granulating the mixed powders at a temperature between the melting point of $B_2O_3$ and the melting point of $Bi_2O_3$ so as to form granulated powders; molding the granulated powders by heating and pressing so as to form a molded article; and sintering the molded article without pressing.

Figure 1:
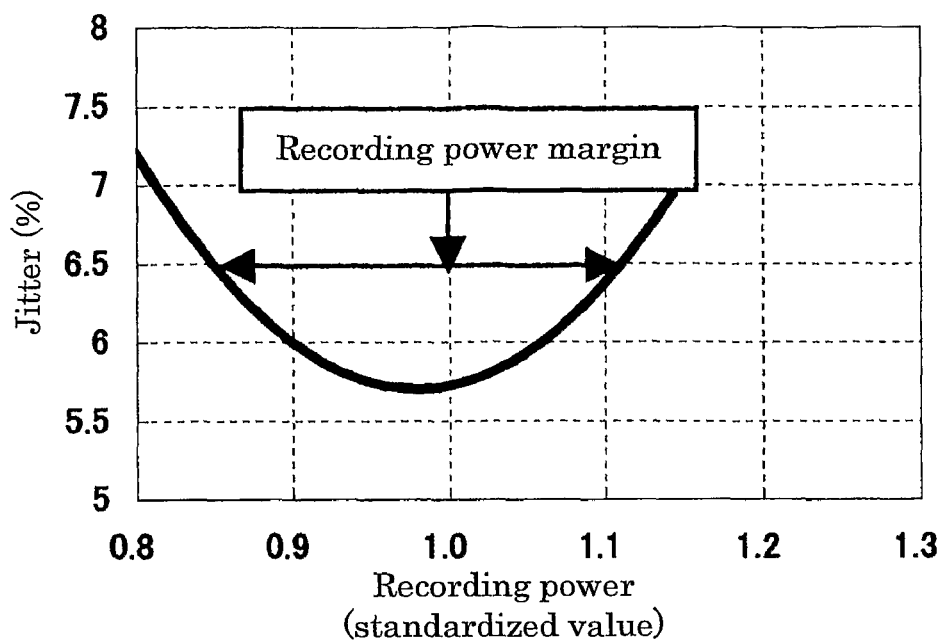
FIG. 1 is an explanatory drawing of an optimum recording power.

BEST MODE FOR CARRYING OUT THE INVENTION (Optical Recording Medium)

An optical recording medium of the present invention contains a substrate and at least a recording layer over the substrate, and further contains other layers as necessary.

The recording layer primarily contains Bi and O (oxygen atom), and further contains B and at least one element X selected from Ge, Li, Sn, Cu, Fe, Pd, Zn, Mg, Nd, Mn and Ni.

Here, the "primarily contain" means that O makes up 55 atomic % to 62 atomic % of all elements constituting the recording layer, and that when the total content of Bi, B and X is assumed to be 100 atomic %, Bi makes up 35 atomic % to 90 atomic %, and preferably 60 atomic % to 75 atomic %. In this case, B makes up 10 atomic % to 55 atomic %, and preferably 20 atomic % to 30 atomic %, and X makes up 2 atomic % to 40 atomic %, and preferably 5 atomic % to 15 atomic %.

The recording layer preferably consists of the following compound represented by formula:

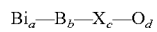

$$Bi_a-B_b-X_c-O_d$$

wherein a, b, c and d represents atomic % of respective element: a is 27 atomic % to 34 atomic %; b is 9 atomic % to 14 atomic %; c is 2 atomic % to 7 atomic %; and d is 55 atomic % to 62 atomic %, a+b+c+d=100 atomic %, and X represents at least one element selected from Ge, Li, Sn, Cu, Fe, Pd, Zn, Mg, Nd, Mn and Ni.

Examples of the element X include Sr, Ba, Ca, Mo, W, Co, Si, In, Ti, Ga, Zr, Cr, Hf, K, Na, Ag, P, Ta, Y, Nb, Al, V, Sb, Te and Lanthanide series elements other than Nd.

When an element such as Ge, Sn or Li having formation enthalpy Io (a measure of the easiness of forming oxides) is equal to that of Bi, the oxides easily releases oxygen to be a single element, and thus optical absorptance is improved. Moreover, the melting point of the element X is changed and sensitivity can be improved.

The element such as Li, Na, Mg, K, Ca or P has a property of easy vitrification under the presence of bismuth oxide. The mechanism of vitrification is not clarified, but the easy vitrification may possibly relate to improvement of sensitivity.

In case of the element such as Cu, Ag and Pd, which is relatively difficultly oxidized, the element itself is hardly oxidized, but B is easily oxidized, and thus oxygen in a Bi oxide tends to be taken out. Consequently, the probability that Bi is present as metal becomes high. As a result, Bi and the element such as Cu, Ag and Pd are present as metal, and then the sensitivity is improved.

The lanthanide series elements are more easily oxidized than Bi. Bi is easily present as a single metal, and may contribute to improvement of sensitivity.

In a method of layer deposition such as a sputtering method, a condition of excess oxygen can be made in a layer. In this case, oxygen is present in a layer in an unstable configuration such as interstitial oxygen, and an element X is added in the layer so as to improve sensitivity. This is very effective.

The recording layer of the optical recording medium of the present invention particularly preferably consists of either Bi, B, O and Ge, or Bi, B, O and Sn. However, impurities which cannot be removed may be contained in the recording layer.

The recording layer in which Ge or Sn are added increases optical absorption and improves sensitivity, and exhibits excellent property in high linear velocity recording. The mechanism is not clarified, but oxidation of Bi is suppressed by adding Ge or Sn, and then Bi metal is easily deposited. Therefore optical absorption is increased and sensitivity is improved.

As can be seen from the result of Table 1 of Examples hereinafter, broad recording power margin can be obtained by using Ge or Sn as an element to be added, thus stable recording is performed to thereby obtain a large effect.

The recording layer is generally formed by a sputtering method. Conventionally, reflectance, jitter and recording sensitivity have been optimized by the composition of the recording layer and layer configuration. In the present invention, the recording sensitivity can be controlled under an optimum condition of Ar flow rate during recording layer deposition. The production method is very effective, because properties can be controlled only by changing the Ar flow rate during recording layer deposition.

Figure 2:
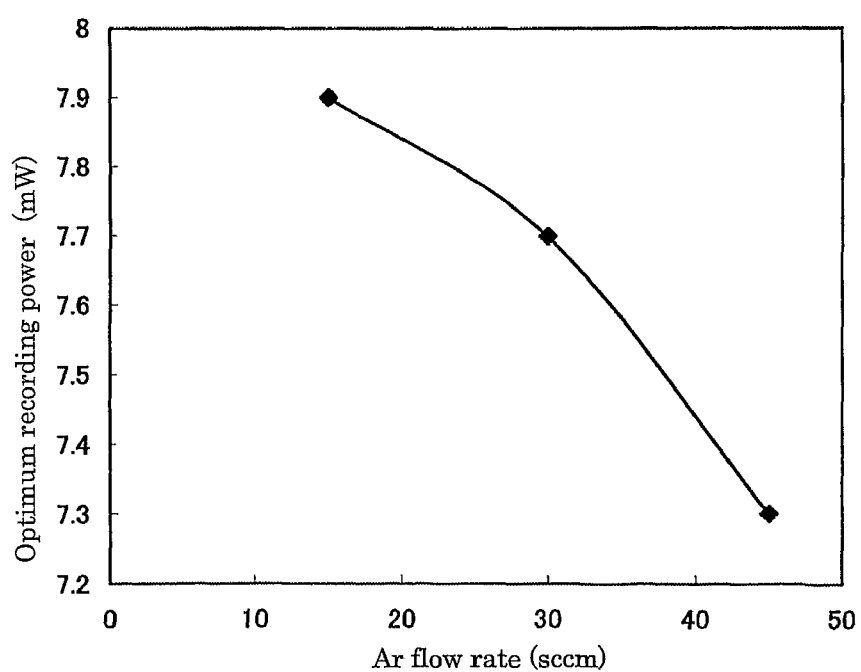
FIG. 2 shows changes in the optimum recording power with changes in Ar flow rate during recording layer deposition.

In Example 1 described hereinafter, changes in the optimum recording power with changes in Ar flow rate during recording layer deposition is shown in FIG. 2. As is clear from FIG. 2, when Ar flow rate is small, sensitivity is poor. Because the sensitivity increases as the Ar flow rate increases, the recoding sensitivity can be controlled by controlling the Ar flow rate.

(Sputtering Target)

A sputtering target of the present invention contains Bi and B and further contains at least one element X selected from Ge, Li, Sn, Cu, Fe, Pd, Zn, Mg, Nd, Mn and Ni. Bi, B and X are contained in a form of a single element, oxide and other compound.

It is preferred that a constituent element be contained in the form of a single element or an oxide in the sputtering target when the sputtering target is used for forming the recording layer, because the recording layer of the optical recording medium of the present invention is necessary to primarily contain an oxide. However, when the sputtering target is contained as the single element, an oxide layer is necessarily formed by adding oxygen during layer deposition.

A target in the form of an oxide may be preferably used in order to contain a constituent element in the form of an oxide in the recording layer. With a view to productivity, in order to achieve reduction of a cost for productive facilities, downsizing an apparatus volume and simplification, a nonoxide target having low resistance is preferably used for direct-current sputtering. A layer containing an oxide is formed using a target containing no oxygen or less oxygen under an oxygen-introduced atmosphere during layer deposition, and then a layer deposition rate can be improved.

Use of a target of alloy or compound, which consists of Bi, B and X can be very effective. An oxide layer can be formed under an atmosphere in which oxygen is introduced in addition to Ar during layer deposition. When the target has a resistance of 10 Ωcm or less, the direct-current sputtering can be performed. The target having a resistance of 1 Ωcm or less is preferably used, because the target becomes less likely to change over time. Moreover, the target having a resistance of 0.1 Ωcm or less is more preferably used because abnormal discharge is less likely to occur, and then power supply voltage of direct current can be increased, whereby the layer deposition rate can be further increased. To obtain a target having a resistance of 10 ≠cm or less, for example, a substance may be added to the target so as to impart conductivity, or oxygen atoms in the target may be removed to reduce its electrical resistance when the target is an oxide. Examples of the substances capable of imparting conductivity include carbon, ITO and metal. When direct-current sputtering is applied to an oxide, the resistance is preferably as low as possible. However, a target having a resistance of less than 10 Ωcm is not preferred, because an optical recording medium having layers formed by using the target offers poor characteristics. For this reason, a countermeasure should be taken, for example, a layer is formed by mixing oxygen.

A target which can be magnetron-sputtered is preferably used, because the layer deposition rate can be increased. The magnetron sputtering can be applied to the target by means of any one of the following methods: preparing a sputtering target consisting only of a non-ferromagnetic substance; reducing magnetic permeability so as to leak magnetic flux to a surface; making the sputtering target thinner so that magnetic flux is easily saturated; or making the sputtering target into a shape or a structure that facilitates leakage of magnetic flux. Moreover, when a non-ferromagnetic target is used, it is formed so as to facilitate leakage of magnetic flux, or the distribution of magnetic flux in the non-ferromagnetic target is changed, and then use efficiency of the target and homogeneity of a layer formed from the target can be improved.

A sputtering target containing oxygen, and primarily containing Bi and oxygen is preferably used. Here, the "primarily contain" means that O makes up 55 atomic % to 62 atomic % of all elements constituting the target, and that when the total content of Bi, B and X is assumed to be 100 atomic %, Bi makes up 35 atomic % to 90 atomic %, and preferably 60 atomic % to 75 atomic %. In this case, B makes up 10 atomic % to 55 atomic %, and preferably 20 atomic % to 30 atomic %, and X makes up 2 atomic % to 40 atomic %, and preferably 5 atomic % to 15 atomic %.

The target primarily contains oxygen, whereby temporal change of the target is decreased, and the composition of formed layer becomes more stable. Particularly, Ge, Li, Sn, Cu, Fe, Pd, Zn, Mg, Nd, Mn or Ni contributes to high strength of the target, and a layer is not easily damaged, even though an applied power is increased to increase layer deposition rate. An optical recording medium having a recording layer which is formed by using the target, in which those elements are added, has excellent properties, particularly excellent in high linear velocity recording property.

Of these, a sputtering target consisting of Bi, B, O and Ge, or a sputtering target consisting of Bi, B, O and Sn is preferred. However, impurities which cannot be removed may be contained in the sputtering target. When the recording layer is formed by using these sputtering targets, optical absorption of the recording layer is increased and sensitivity is improved, and then the recording layer is excellent in high linear velocity recording.

A sputtering target containing a composite oxide of Bi and B is preferably used. Here, a composite oxide is defined as an oxide which contains two ore more elements, for example, the composite oxide of Bi and B means compounds such as $Bi_4B_2O_9$, $Bi_3B_5O_{12}$, and $Bi_{24}B_2O_{39}$. By containing a composite oxide such as $Bi_4B_2O_9$, the strength of the target is improved. This is considered that bonding is further strengthened because the target is present as a compound. The target containing $Bi4B_2O_9$ has high strength, and an optical recording medium having a recording layer formed by using the target containing $Bi_4B_2O_9$ exhibits particularly excellent properties.

Additionally, a sputtering target containing a composite oxide of Bi and X is preferably used. By containing the composite oxide consisting of Bi and X, the elements are strongly bonded. A layer preferably consists of only the composite oxide, because it may obtain high homogeneity, and improves the strength of the target. When the composite contains a large amount of Bi, the strength of the target may be often decreased. However, $Bi_{12}GeO_{20}$ contained in the composite can prevent decrease of the strength.

The sputtering target is preferably crystalline. When the sputtering target is amorphous, the target may be partially or entirely crystallized due to rise of target temperature during layer deposition. The layer property and composition may differ, because the strength of atomic bond differs depending on amorphous or crystal. The crystal may suppress temporal change. Moreover, deviation of compositions and nonuniformity of crystal structure can be suppressed by making a crystal particle size and crystal size uniform, and finely dividing crystals.

Moreover the sputtering target contains an element as an oxide, and has oxygen content of the oxide which is smaller than the stoichiometric composition. It is known that recording property of the optical recording medium after layer deposition may be improved by reducing oxygen in the composition of the recording layer, compared to the stoichiometric composition. A layer having a stable composition can be formed by fixing the oxygen content in the target beforehand, rather than by controlling the oxygen content by means of introducing oxygen during layer deposition. Alternatively, less amount of oxygen strengthen the crystal bonding force, thereby improving target density, strength and layer deposition rate.

The sputtering target preferably has a packing density of 75% to 99%, and more preferably 89% to 99%. When the sputtering target has a packing density of less than 75%, a low packing density significantly decreases layer deposition rate and makes a target itself fragile, thus many problems occur such as target breaking during layer deposition.

(Method for Producing Sputtering Target)

A method for producing a sputtering target of the present invention is a method in which the sputtering target of the present invention is produced by a sintering method, and includes a step of removing moisture from a powder of raw material, and further includes other steps if necessary.

The sputtering target of the present invention contains B. $B_2O_3$ is preferably used because it is relatively inexpensive as a raw material containing B. However, $B_2O_3$ easily absorbs moisture, and thus the method preferably includes the step of removing moisture. Thus, measurement errors of amount of raw material can be decreased, and reproducibility of the composition may be increased.

The method for producing the sputtering target of the present invention is preferably a method in which a powder containing $Bi_2O_3$, $B_2O_3$ and an oxide of X is sintered as a raw material. By the sintering method, a suitable target can be produced even by using a raw material such as an oxide having a high melting point. The powder of $Bi_2O_3$ and $B_2O_3$ has inexpensive because of its readily availability. A target having high strength can be easily obtained, because the powder of $Bi_2O_3$ and $B_2O_3$ has a relatively low melting point. A powder of the oxide of X is advantageous in cost, provided that a simple powder is used. Due to hydrophilicity of $B_2O_3$, the powder is pulverized by dry process or in an organic solvent, and classified to obtain a powder having a uniform particle size. Further, the powder is mixed and molded by heating and pressing so as to adjust the shape, and then calcined at a temperature kept at 650° C. in an atmosphere. The strength of the target can be improved by repeating the process in which once calcined powder is pulverized again and molded by heating and pressing. In the case where the target in which $B_2O_3$ remains as a raw material absorbs moisture, hygroscopicity may increase and the target quality may be decreased. To prevent the decrease of the target quality, the powder is mixed in a condition such that the powder does not absorb moisture, and sintered at a temperature between the melting point of $B_2O_3$ and the melting point of $Bi_2O_3$. The obtained powder is pulverized again, molded by heating and pressing, and then calcined to obtain a highly uniform target and it is very effective. Alternatively, the powder may be pulverized while sintering at a temperature between the melting point of $B_2O_3$ and the melting point of $Bi_2O_3$. Particularly, it is important to include a step of completely removing $B_2O_3$ from the target. A raw material is mixed, and then pulverized and granulated in an oxygen atmosphere while the temperature is kept between the melting point of $B_2O_3$ and the melting point of $Bi_2O_3$ so as to melt $B_2O_3$. The melted $B_2O_3$ is contained in other materials and then easily reacted. After the powder has been mixed and sintered, the target is then bonded to a backing plate made of oxygen-free copper by metal bonding or resin bonding to produce a sputtering target.

The rough flow of the production process may include steps of weighing a raw material, mixing in a dry ball mill, hot pressing, molding and bonding. Alternatively, the process including steps of weighing, mixing in a wet ball mill, spray drying, hot pressing, molding and bonding may be used.

In the optical recording medium of the present invention, protective layers (a first protective layer or a second protective layer) are preferably disposed on both surfaces of the recording layer. These protective layers suppress deformation and breaking of the recording layer, and have a function of accepting melting, composition change and diffusion of the recording layer. Moreover, in general, these protective layers preferably pass through light of recording and reproducing wavelength in order to improve reflectance, and the function of optical absorption relative to recording and reproducing wavelength may be imparted to some extend so as to adjust recording sensitivity.

Disposition of the protective layer allows to make the influence to deformation of recording marks very smaller than that of conventional optical recording media, and to prevent significant increase of influence to deformation of recording marks due to increase of recording power at high linear velocity recording, thus it is effective for improvement of high linear velocity recording property. Additionally, it is effective for improvement of storage stability.

As materials for the first and second protective layers, sulfides are preferably used. A sulfide and the material of the recording layer are mixed, reacted and mutually dispersed, and thus recording marks can be easily formed in a good condition so as to further speed up recording, thereby recording sensitivity may be improved. However, this cause is not clear. Moreover, because many sulfides are relatively soft, stress caused by deformation of the recording layer during recording may be easily reduced.

Examples of the sulfides include ZnS, CaS, SrS, BiS, GeS and mixtures thereof. Further, the sulfides may be mixed with oxides, nitrides and the like.

A material primarily containing ZnS and $SiO_2$ is particularly preferred in terms of transparency to recording and reproducing light, and productivity. A material preferably primarily contains $SiO_2$, ZrO2, $Ta_2O_5$ or $SnO_2$ to obtain sufficient adiabatic effect.

As the material for the first and second protective layer, oxides, nitrides and carbides which are relatively hard and have low reactivity may be preferably used, because distortion, and composition change of the recording mark may not easily occur after recording marks are formed, and additionally decomposition, sublimation, hollowing may not occur by heat of the recording layer.

Examples of the materials for the first and second protective layers include simple oxides such as $Al_2O_3$, MgO, $ZrO_2$, $SnO_2$, $Nb_2O_5$, $Ta_2O_5$, $SiO_2$, $Y_2O_3$, $CeO_2$, ZnO, $TiO_2$ and $In_2O_3$; composite oxides of the aforementioned oxides, silicate oxides such as $2MgO.SiO_2$, $MgO.SiO_2$, $CaO.SiO_2$, $ZrO_2.SiO_2$, $3Al_2O_3.2SiO_2$, $2MgO.2Al_2O_3.5SiO_2$ and $Li_2O.Al_2O_3.4SiO_2$; nitrides such as silicon nitride, aluminum nitride, BN and TiN; carbides such as SiC, $B_4C$, TiC, WC and amorphous carbon; composite compounds such as SiON, AlON, SiAlON, TiOC and SiOC.

Moreover, fluorides such as $MgF_2$, and $CaF_2$ may be also used, and borides may be also used by taking advantage of hardness and high thermal conductivity.

Additionally, as the material for the first and second protective layers, organic materials such as dyes and resins can be used.

Examples of the dyes include polymethine dyes, naphthalocyanine dyes, phthalocyanine dyes, squarylium dyes, chloconium dyes, pyrylium dyes, naphthoquinone dyes, anthraquinone dyes (indanthrene dyes), xanthene dyes, triphenylmethane dyes, azulene dyes, tetrahydrocholine dyes, phenanthrene dyes, triphenothiazine dyes, azo dyes, formazan dyes, and metal complex compounds thereof.

Examples of the resins include polyvinyl alcohols, polyvinyl pyrrolidones, cellulose nitrates, cellulose acetates, ketone resins, acrylic resins, polystyrene resins, urethane resins, polyvinyl butyrals, polycarbonates, and polyolefins. Each of these resins may be used alone or in combination with two or more.

The first and second protective layers can be formed by commonly used means such as vapor depositions, sputtering, CVD, i.e. Chemical Vapor Deposition, coating of a solvent or the like. When a coating method is used, the above-noted organic materials and the like are dissolved in an organic solvent and the solvent is coated by commonly used coating methods such as spraying, roller-coating, dipping, and spin-coating.

The organic solvent used for the coating method is not particularly limited and may be appropriately selected depending on the purpose. Examples of the organic solvents include alcohols such as methanol, ethanol, and isopropanol; ketones such as acetone, methyl ethyl ketone, and cyclohexanone; amides such as N,N-dimethylacetoamide and N,N-dimethylformamide; sulfoxides such as dimethylsulfoxide; ethers such as tetrahydrofuran, dioxane, diethyl ether and ethylene glycol monomethyl ether; esters such as methyl acetate and ethyl acetate; aliphatic halocarbons such as chloroform, methylenechloride, dichloroethane, carbon tetrachloride and trichloroethane; aromatic series such as benzene, xylene, monochlorobenzene and dichlorobenzene; cellosolves such as methoxyethanol and ethoxyethanol; and hydrocarbons such as hexane, pentane, cyclohexane and methylcyclohexane. Each of these may be used alone or in combination with two or more.

The optical recording medium of the present invention is preferably produced by disposing at least the second protective layer, the recording layer, the first protective layer and a reflective layer over a substrate in this order. This layer configuration enables to obtain the optical recording medium having excellent sensitivity, capable of high linear velocity recording, according to HD DVD-R standard.

Figure 5:
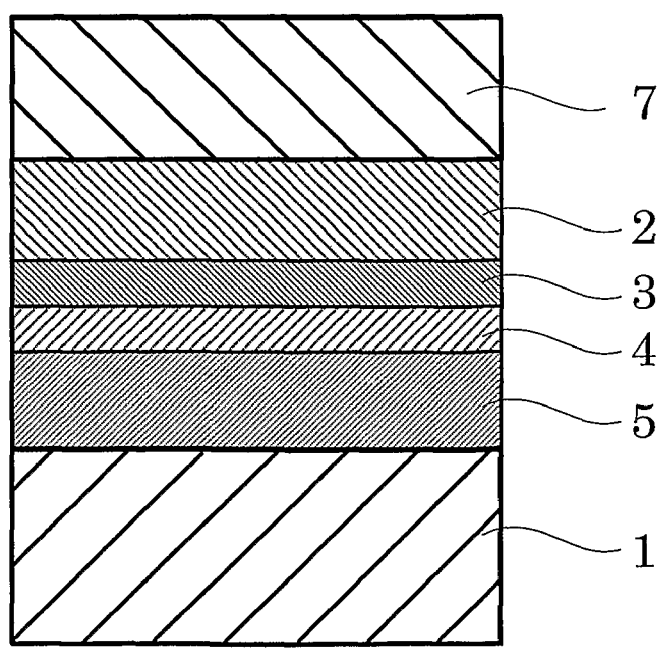
FIG. 5 shows an example of a layer configuration of an optical recording medium according to HD DVD-R standard.

FIG. 5 shows an example of a layer configuration of an optical recording medium according to HD DVD-R standard, a second protective layer 5, a recording layer 4, a first protective layer 3, a reflective layer 2 and an overcoat layer 7 over a substrate 1 in this order.

When a high numerical aperture lens is used to achieve high density recording, at least the reflective layer, the first protective layer, the recording layer, the second protective layer and a cover layer are disposed over the substrate in this order. This layer configuration enables to obtain the optical recording medium having excellent sensitivity, capable of high linear velocity recording, according to BD-R standard.

Figure 6:
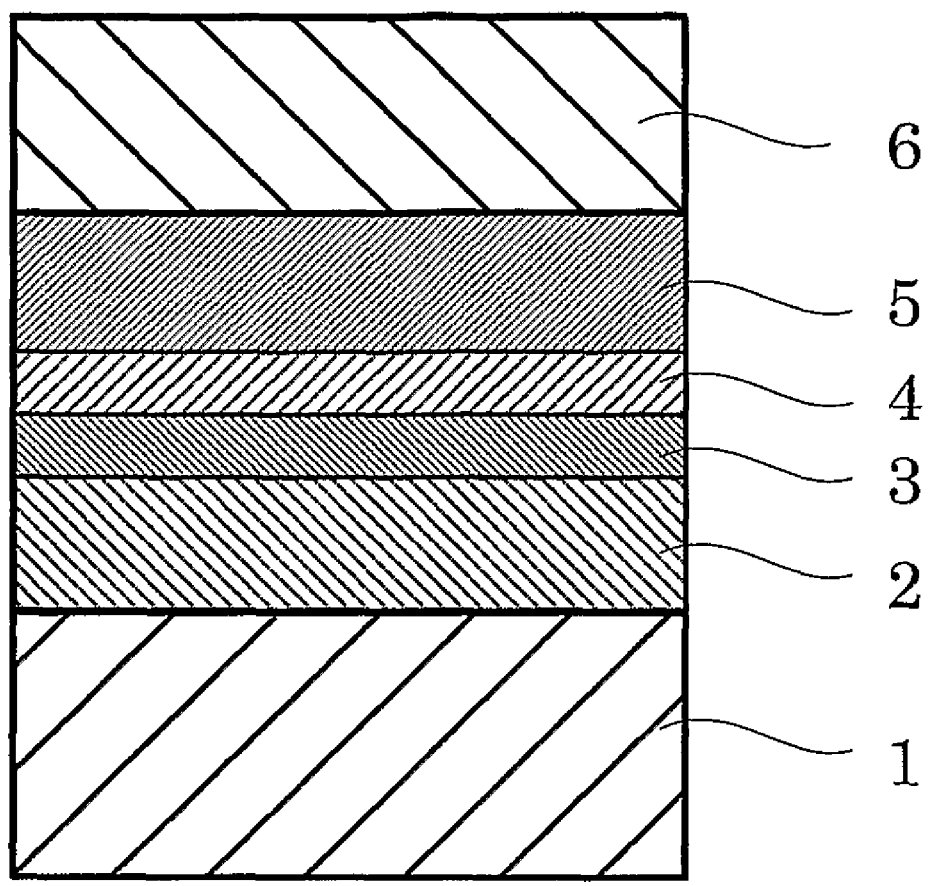
FIG. 6 shows an example of a layer configuration of an optical recording medium according to BD-R standard.

FIG. 6 shows an example of a layer configuration of an optical recording medium according to BD-R standard, a reflective layer 2, a first protective layer 3, a recording layer 4, a second protective layer 5 and a cover layer 6 over a substrate 1 in this order.

For the first protective layer and the second protective layer, the same or different materials may be used. Moreover, each of the first and second protective layers is formed from two or more layers to obtain a large effect.

For example, the first protective layer is formed from two layers, and a preferable combination of layers is, for example, a layer using a material containing a sulfide adjacent to the recording layer, and a layer which does not contain a sulfide adjacent to the reflective layer in terms of sensitivity and storage property.

Materials for the substrate and cover layer are not particularly limited and may be appropriately selected depending on the purpose, as long as they have excellent thermal and machine properties, and also have excellent light transmission properties when recording and reproducing is performed through the substrate. Specifically, examples thereof include polycarbonates, polymethyl methacrylates, amorphous polyolefins, cellulose acetates and polyethylene terephthalate. Of these polycarbonates and amorphous polyolefins are preferable.

When a high numerical aperture lens is used to achieve high density recording, a portion through which the reproducing light passes is necessarily made thinner. With an increasing numerical aperture, when the perpendicular direction to the plane of the disc deviates from the optical axis of an optical pickup at a certain angle (tilt angle), aberration occurs. The allowance in the aberration decreases with an increasing numerical aperture. The tilt angle is in proportional to the square of the product of reciprocal of the wavelength of an optical source and the numerical aperture of the objective lens and is susceptible to the aberration due to the thickness of the substrate. To reduce the influence of the aberration on the tilt angle, a cover layer thinner than a normal substrate is disposed and recording and reproducing is performed from the side of the cover layer. As a result, high recording density beyond BD-R standard can be achieved.

When recording is performed using near-field light, a thin layer having a thickness of several to several tens of nanometers is used as the cover layer. When this layer has a high-refractive index, light is not diffused in the layer, and reaches the recording layer while the light kept in a small spot, thereby preferably used for high density recording. As a material for the cover layer, hard and wear-resistant material having good sliding property is preferably used because the cover layer is formed in a thin layer. Examples thereof include silicon nitride and diamond-like carbon.

For the reflective layer, metals such as Al, Al—Ti, Al—In, Al—Nb, Au, Ag, and Cu, semimetals, and alloys thereof may be used. Each of these materials may be used alone or in combination with two or more. Of these, single metals such as Ag, Cu, Al or alloys thereof may be preferably used in terms of thermal conductivity and reflectance.

Examples of methods for forming the reflective layer using these materials include a sputtering method, ion-plating method, chemical vapor deposition and vacuum vapor deposition.

When the reflective layer is formed from alloy, it is possible to prepare it by using the alloy as a target material by sputtering. Besides, it is also possible to form the reflective layer by tip-on-target method, for example, a Cu tip is placed on an Ag target material to form the reflective layer, and by co-sputtering, for example, an Ag target and a Cu target are used.

It is also possible to alternately stack low-refractive index layers and high-refractive index layers using materials other than metals to form a multi-layered configuration, which is used as the reflective layer.

The reflective layer preferably has a thickness of 5 nm to 300 nm, and more preferably 30 nm to 90 nm for the best high velocity recording property.

When the reflective layer contains Ag and the protective layer is formed from a material containing S, a sulfuration prevention layer may be provided between the reflective layer and the protective layer to prevent reaction between Ag and S. As a material for the sulfuration prevention layer, oxides, nitrides and carbides which have small optical absorption are preferred. Examples thereof include nitrides primarily containing SiN, oxides such as $TiO_2$ and carbides such as SiC.

The sulfuration prevention layer preferably has a thickness of 2 nm to 7 nm. When the sulfuration prevention layer has a thickness of less than 2 nm, the layer may be uneven and then prevention effect may be lost. When the sulfuration prevention layer has a thickness of more than 7 nm, reflectance and recording sensitivity may be decreased.

A thick environmental protective layer is preferably formed on the reflective layer. A material for the environmental protective layer is not particularly limited and may be appropriately selected depending on the purpose, provided that the material can protect the reflective layer from external forces. Various organic materials and inorganic materials are used therefor. Examples of the organic materials include thermoplastic resins, thermosetting resins, electron beam curable resins and ultraviolet curable resins. Examples of the inorganic materials include $SiO_2$, $Si_3N_4$, $MgF_2$ and $SnO_2$.

Examples of methods for forming the environmental protective layer include coating methods such as spin-coating, casting; a sputtering method, and chemical vapor deposition. Of these, spin-coating is preferably used.

When the thermoplastic resin or thermosetting resin is used for the environmental protective layer, they are dissolved in a suitable solvent, coated on the reflective layer and dried to form the environmental protective layer. The environmental protective layer using an ultraviolet curable resin can be formed by directly coating the ultraviolet curable resin on the reflective layer or dissolving the ultraviolet curable resin in a suitable solvent to prepare a coating solution and coating the coating solution on the reflective layer, and then applying ultraviolet ray to the coating solution to harden it. As the ultraviolet curable resins, for example, acrylate resins such as urethane acrylates, epoxy acrylates, and polyester acrylates can be used.

Each of these materials may be used alone or in combination with two or more and may be formed in not only a single layer but also in a multi-layered configuration.

The environmental protective layer has a thickness of preferably 0.1 µm to 100 µm and more preferably 3 µm to 30 µm.

The present invention can provide a write-once-read-many optical recording medium having high sensitivity and suitable for high linear velocity recording, and a sputtering target suitable for producing the optical recording medium, particularly, a sputtering target capable of improving layer deposition rate, has high strength during layer deposition, and high packing density, and a method for producing the sputtering target.

EXAMPLES

Hereinafter, with reference to Examples and Comparative Examples, the present invention will be explained in detail and the following Examples and Comparative Examples should not be construed as limiting the scope of the invention. In a composition (atomic %) of a target for forming a recording layer, the content of elements other than oxygen is analyzed by ICP (high frequency Inductively Coupled Plasma) Emission Spectrometry, and the content of oxygen is analyzed by an inert gas melting infrared absorption method.

Example 1

—Production of Optical Recording Medium—

On a polycarbonate substrate provided with a groove (groove depth of 21 nm, track pitch of 0.32 µm) having a thickness of 1.1 mm and a diameter of 120 mm (product name: ST3000 by Teijin-Bayer Politec Ltd.), a reflective layer having a thickness of 60 nm and containing AgBi alloy (0.5 mass % of Bi), a SiN layer having a thickness of 4 nm, a first protective layer having a thickness of 15 nm and containing ZnS and $SiO_2$ where $ZnS:SiO_2=80:20$ (mole %), a recording layer having a thickness of 16 nm and containing Bi—B—Ge—O, and a second protective layer having a thickness of 75 nm and containing ZnS and $SiO_2$ where $ZnS:SiO_2=80:20$ (mole %) were formed in this order by sputtering (DC sputtering for layer deposition of AgBi and AC sputtering for layer deposition of others using DVD sprinter manufactured by Oerlikon).

Further, a polycarbonate sheet (PURE-ACE by Teijin Chemicals Ltd.) having a thickness of 75 µm was bonded on the second protective layer using an ultraviolet curable resin (DVD003 by Nippon Kayaku Co., Ltd.) so as to form a cover layer (optically transparent layer), thereby yielding a write-once-read-many optical recording medium having a thickness of approximately 1.2 mm. The recording layer was formed by using a target containing $Bi_{27.1}B_{12.5}Ge_{2.1}O_{58.3}$.

The write-once-read-many optical recording medium was evaluated for a jitter value using an optical disc drive evaluation device ODU-1000 manufactured by Pulstec Industrial Co., Ltd. (wavelength of 405nm, numerical aperture NA of 0.85) by performing recording at a linear velocity of 4 times the linear velocity (1×) used for a write-once-read-many Blu-ray disc standard (BD-R Version 1.1). The write-once-read-many optical recording medium had a recording density the same as that of the write-once-read-many Blu-ray disc standard (BD-R Version 1.1).

As a result, a jitter value of 5.5% at an optimum recording power of 7.7 mW was obtained.

The write-once-read-many optical recording medium in Example 1 could obtain high sensitivity and low jitter property, compared to the write-once-read-many optical recording medium having a Bi—B—O containing-recording layer in Comparative Example 1 described below.

Comparative Example 1

—Production of Optical Recording Medium—

On a polycarbonate substrate (product name: ST3000 by Teijin-Bayer Politec Ltd.) provided with a groove (groove depth of 21 nm, track pitch of 0.32 μm) having a thickness of 1.1 mm and a diameter of 120 mm, a reflective layer having a thickness of 35 nm and containing AlTi alloy (1.0 mass % of Ti), a first protective layer having a thickness of 10 nm and containing ZnS and $SiO_2$ where $ZnS:SiO_2=80:20$ (mole %), a recording layer having a thickness of 16 nm and containing Bi, B and O (a Bi—B—O layer) and a second protective layer having a thickness of 10 nm and containing ZnS and $SiO_2$ where $ZnS:SiO_2=80:20$ (mole %) were formed in this order by sputtering by means of the same apparatus and condition as in Example 1.

Further, a polycarbonate sheet (PURE-ACE by Teijin Chemicals Ltd.) having a thickness of 75 μm was bonded on the second protective layer using an ultraviolet curable resin (DVD003 by Nippon Kayaku Co., Ltd.) so as to form a cover layer (optically transparent layer), thereby yielding a write-once-read-many optical recording medium having a thickness of approximately 1.2 mm. The recording layer was formed by using a target containing $Bi_{28.5}B_{14.3}O_{57.1}$.

The write-once-read-many optical recording medium was evaluated for a jitter value by performing recording in the same manner as in Example 1.

As a result, a jitter value of 6.2% at an optimum recording power of 10.2 mW was obtained.

Example 2

—Production of Optical Recording Medium—

A write-once-read-many optical recording medium was produced in the same manner as in Example 1, except that the material of the recording layer was changed to Bi—B—Cu—O.

The recording layer was formed by using a target containing $Bi_{27.4}B_{12.6}Cu_{2.1}O_{57.9}$.

The write-once-read-many optical recording medium was evaluated for a jitter value using an optical disc drive evaluation device ODU-1000 manufactured by Pulstec Industrial Co., Ltd. (wavelength of 405 nm, numerical aperture NA of 0.85) by performing recording at a linear velocity of 2× on the basis of the linear velocity of 1× used for a write-once-read-many Blu-ray disc standard (BD-R Version 1.1). The write-once-read-many optical recording medium had a recording density the same as that of the write-once-read-many Blu-ray disc standard (BD-R Version 1.1).

As a result, a jitter value of 5.3% at an optimum recording power of 6.8 mW was obtained.

The write-once-read-many optical recording medium in Example 2 could obtain high sensitivity and low jitter property, compared to that in Comparative Example 2.

Comparative Example 2

—Production of Optical Recording Medium—

The write-once-read-many optical recording medium produced in Comparative Example 1 was evaluated for a jitter value by performing recording in the same manner as in Example 2. As a result, a jitter value of 5.7% at an optimum recording power of 7.0 mW was obtained.

Example 3

—Production of Optical Recording Medium—

A write-once-read-many optical recording medium was produced in the same manner as in Example 1 and evaluated for a jitter value by performing recording in the same manner as in Example 1, except that Bi—B—Fe—O was used instead of Bi—B—Ge—O. As a result, a jitter value of 5.7% at an optimum recording power of 6.8 mW was obtained. The 2 o recording layer was formed by using a target containing $Bi_{26.4}B_{12.0}Fe_{1.9}O_{59.6}$.

The write-once-read-many optical recording medium in Example 3 could obtain high sensitivity and low jitter property, compared to the write-once-read-many optical recording medium having a Bi—B—O containing-recording layer in Comparative Example 1.

Example 4

—Production of Optical Recording Medium—

A write-once-read-many optical recording medium was produced in the same manner as in Example 1 and evaluated for a jitter value by performing recording in the same manner as in Example 1, except that Bi—B—Pd—O was used instead of Bi—B—Ge—O. As a result, a jitter value of 5.4% at an optimum recording power of 8.8 mW was obtained. The recording layer was formed by using a target containing $Bi_{26.8}B_{12.4}Pd_{2.1}O_{58.8}$.

The write-once-read-many optical recording medium in Example 4 could obtain high sensitivity and low jitter property, compared to the write-once-read-many optical recording medium having a Bi—B—O containing-recording layer in Comparative Example 1.

Example 5

—Production of Optical Recording Medium—

A write-once-read-many optical recording medium was produced in the same manner as in Example 1 and evaluated for a jitter value by performing recording in the same manner as in Example 1, except that Bi—B—Zn—O was used instead of Bi—B—Ge—O. As a result, a jitter value of 5.7% at an optimum recording power of 6.4 mW was obtained. The recording layer was formed by using a target containing $Bi_{26.9}B_{12.3}Zn_{2.0}O_{58.8}$.

The write-once-read-many optical recording medium in Example 5 could obtain high sensitivity and low jitter property, compared to the write-once-read-many optical recording medium having a Bi—B—O containing-recording layer in Comparative Example 1.

Example 6

—Production of Optical Recording Medium—

A write-once-read-many optical recording medium was produced in the same manner as in Example 1 and evaluated for a jitter value by performing recording in the same manner as in Example 1, except that Bi—B—Li—O was used instead of Bi—B—Ge—O. As a result, a jitter value of 5.9% at an optimum recording power of 7.9 mW was obtained. The recording layer was formed by using a target containing $Bi_{26.6}B_{12.3}Li_{2.1}O_{59.0}$.

The write-once-read-many optical recording medium in Example 6 could obtain high sensitivity and low jitter property, compared to the write-once-read-many optical recording medium having a Bi—B—O containing-recording layer in Comparative Example 1.

Example 7

—Production of Optical Recording Medium—

A write-once-read-many optical recording medium was produced in the same manner as in Example 1 and evaluated for a jitter value by performing recording in the same manner as in Example 1, except that Bi—B—Sn—O was used instead of Bi—B—Ge—O. As a result, a jitter value of 5.6% at an optimum recording power of 8.2 mW was obtained. The recording layer was formed by using a target containing $Bi_{26.3}B_{12.1}Sn_{2.0}O_{59.6}$.

The write-once-read-many optical recording medium in Example 7 could obtain high sensitivity and low jitter property, compared to the write-once-read-many optical recording medium having a Bi—B—O containing-recording layer in Comparative Example 1.

Example 8

—Production of Optical Recording Medium—

A write-once-read-many optical recording medium was produced in the same manner as in Example 1 and evaluated for a jitter value by performing recording in the same manner as in Example 1, except that Bi—B—Mg—O was used instead of Bi—B—Ge—O. As a result, a jitter value of 5.7% at an optimum recording power of 8.4 mW was obtained. The recording layer was formed by using a target containing $Bi_{27.4}B_{12.5}Mg_{2.1}O_{58.0}$.

The write-once-read-many optical recording medium in Example 8 could obtain high sensitivity and low jitter, compared to the write-once-read-many optical recording medium having a Bi-B-O containing-recording layer in Comparative Example 1.

Example 9

—Production of Optical Recording Medium—

A write-once-read-many optical recording medium was produced in the same manner as in Example 1 and evaluated for a jitter value by performing recording in the same manner as in Example 1, except that Bi—B—Nd—O was used instead of Bi—B—Ge—O. As a result, a jitter value of 6.0% at an optimum recording power of 8.8 mW was obtained. The recording layer was formed by using a target containing $Bi_{26.4}B_{12.2}Nd_{2.1}O_{59.3}$.

The write-once-read-many optical recording medium in Example 9 could obtain high sensitivity and low jitter property, compared to the write-once-read-many optical recording medium having a Bi—B—O containing-recording layer in Comparative Example 1.

Example 10

—Production of Optical Recording Medium—

A write-once-read-many optical recording medium was produced in the same manner as in Example 1 and evaluated for a jitter value by performing recording in the same manner as in Example 1, except that Bi—B—Mn—O was used instead of Bi—B—Ge—O. As a result, a jitter value of 5.8% at an optimum recording power of 6.8 mW was obtained. The recording layer was formed by using a target containing $Bi_{26.3}B_{12.0}Mn_{2.0}O_{59.7}$.

The write-once-read-many optical recording medium in Example 10 could obtain high sensitivity and low jitter property, compared to the write-once-read-many optical recording medium having a Bi—B—O containing-recording layer in Comparative Example 1.

Example 11

—Production of Optical Recording Medium—

A write-once-read-many optical recording medium was produced in the same manner as in Example 1 and evaluated for a jitter value by performing recording in the same manner as in Example 1, except that Bi—B—Ni—O was used instead of Bi—B—Ge—O. As a result, a jitter value of 5.9% at an optimum recording power of 6.9 mW was obtained. The recording layer was formed by using a target containing $Bi_{26.4}B_{12.2}Ni_{2.0}O_{59.4}$.

The write-once-read-many optical recording medium in Example 11 could obtain high sensitivity and low jitter property, compared to the write-once-read-many optical recording medium having a Bi—B—O containing-recording layer in Comparative Example 1.

Comparative Example 3

—Production of Optical Recording Medium—

A write-once-read-many optical recording medium was produced in the same manner as in Example 1 and evaluated for a jitter value by performing recording in the same manner as in Example 1, except that Bi—Ge—O was used instead of Bi—B—Ge—O. As a result, a jitter value of 7.5% at an optimum recording power of 6.7 mW was obtained. The recording layer was formed by using a target containing $Bi_{34.7}Ge_{4.7}O_{60.6}$.

The write-once-read-many optical recording medium in Comparative Example 3 did not obtain lower jitter value than that of the write-once-read-many optical recording medium having a Bi—B—Ge—O containing-recording layer in Example 1.

Example 12

—Production of Optical Recording Medium—

On a polycarbonate substrate provided with a groove (groove depth of 26 nm, track pitch of 0.4 μm), a second protective layer having a thickness of 60 nm and containing ZnS and $SiO_2$ where $ZnS:SiO_2$=80:20 (mole %), a recording layer having a thickness of 15 nm and containing Bi—B—Ge—O, a first protective layer having a thickness of 20 nm and containing ZnS and $SiO_2$ where $ZnS:SiO_2$=80:20 (mole %) and a reflective layer having a thickness of 80 nm and containing AgIn alloy (0.5 atomic % of In) were formed in this order by sputtering by means of the same apparatus and condition as in Example 1. The recording layer was formed by using a target containing $Bi_{27.1}B_{12.5}Ge_{2.1}O_{58.3}$.

Next, on the reflective layer, an ultraviolet curable resin (Nopcocure 134 produced by SAN NOPCO LIMITED) was coated to form an organic protective layer having a thickness of approximately 5 μm by spin-coating, further a dummy substrate having a thickness of 0.6 mm was bonded thereto using an ultraviolet curable resin, thereby yielding a write-once-read-many optical recording medium.

On the write-once-read-many optical recording medium recording was performed using an optical disc drive evaluation device ODU-1000 manufactured by Pulstec Industrial Co., Ltd. (wavelength of 405 nm, numerical aperture NA of 0.65) at a recording density according to HD DVD-R standard "DVD Specifications for High Density Recordable Disc (HD DVD-R) Version 1.0" and a linear velocity of 4 times the standard linear velocity (1×).

As a result, a PRSNR (Partial Response Signal to Noise Ratio) value was 30.0 at an optimum recording power of 16.0 mW.

Comparative Example 4

—Production of Optical Recording Medium—

A write-once-read-many optical recording medium was produced in the same manner as in Example 12, except that the material of the recording layer was changed to Bi—B—O. The recording layer was formed by using a target containing $Bi_{28.5}B_{14.3}O_{57.1}$.

The write-once-read-many optical recording medium was performed using an optical disc drive evaluation device ODU-1000 manufactured by Pulstec Industrial Co., Ltd. (wavelength of 405 nm, lo numerical aperture NA of 0.65) at a recording density according to HD DVD-R standard "DVD Specifications for High Density Recordable Disc (HD DVD-R) Version 1.0" and a linear velocity of 4 times the standard linear velocity (1×).

As a result, a PRSNR value was 27.4 at an optimum recording power of 17.4 mW.

Example 13

—Production of Optical Recording Medium—

On a write-once-read-many optical recording medium having the same layer configuration as that of Examples 1 to 11, the relation between an element X to be added and a recording power margin was analyzed by performing recording at a linear velocity of 4 times the linear velocity (1×) used for a write-once-read-many Blu-ray disc standard (BD-R Version 1.1). The results are shown in Table 1.

Here, "recording power margin" was defined in such a manner that recording was performed by changing recording power to obtain respective jitter values, and each of the recording powers was divided by optimum recording power to obtain a standardized value, and then the relation between the standardized value and the jitter value was obtained to thereby define a range of recording power corresponding to the jitter value of 6.5% or less as a recording power margin. When the properties were changed by variation of laser power for any reason, a broad recording power margin might not generate error, and allowed to perform normal reproduction. Therefore, the broad recording power margin was preferred. For example, in FIG. 1, the optimum recording power is located in a recording power of 1.0 mW. In FIG. 1, the jitter value of 6.5% or less falls within a range of the recording power of 0.85 to 1.11, and then the recording power margin is 0.26.

TABLE 1

| Element X to be added | Recording power margin |
|---|---|
| Ge | 0.26 |
| Cu | 0.16 |
| Fe | 0.12 |
| Pd | 0.15 |
| Zn | 0.19 |
| Li | 0.1 |
| Sn | 0.24 |
| Mg | 0.1 |
| Nd | 0.13 |
| Mn | 0.19 |
| Ni | 0.16 |

As can be seen from the results of Table 1, the element having a larger recording power margin was (approximately 0.10 or more) preferably used. Ge and Sn were particularly preferably used, because the recording power margin of 0.20 or more could be obtained.

Example 14

—Production of Sputtering Target 1—

Powders of $Bi_2O_3$, $B_2O_3$ and $GeO_2$ were weighed in a condition that they were free from water absorption, and then mixed so that the atomic ratio Bi:B:Ge was 70:25:5, followed by dry-mixing in a ball mill for 1 hour. The resultant powder mixture was calcined at 450° C. for 1 hour, dry-mixed and pulverized in a ball mill for 1 hour, and then molded under a pressure of 100 MPa to 200 MPa, heated up at a rate of temperature rise of 20° C./min., sintered at 650° C. for 8 hours in an atmosphere by hot pressing to prepare a sputtering target having a diameter of 200 mm and a thickness of 6 mm.

The target was then bonded to a backing plate made of oxygen-free copper by low-melting metal bonding to produce Sputtering Target 1. Sputtering Target 1 had a packing density of 94.0% and a composition of $Bi_{29.6}B_{10.5}Ge_{1.9}O_{58.0}$. The packing density is a relative density which is obtained by comparison with a theoretical packing density, provided that $Bi_2O_3$, $B_2O_3$ and $GeO_2$ were mixed at a predetermined ratio.

Figure 3:
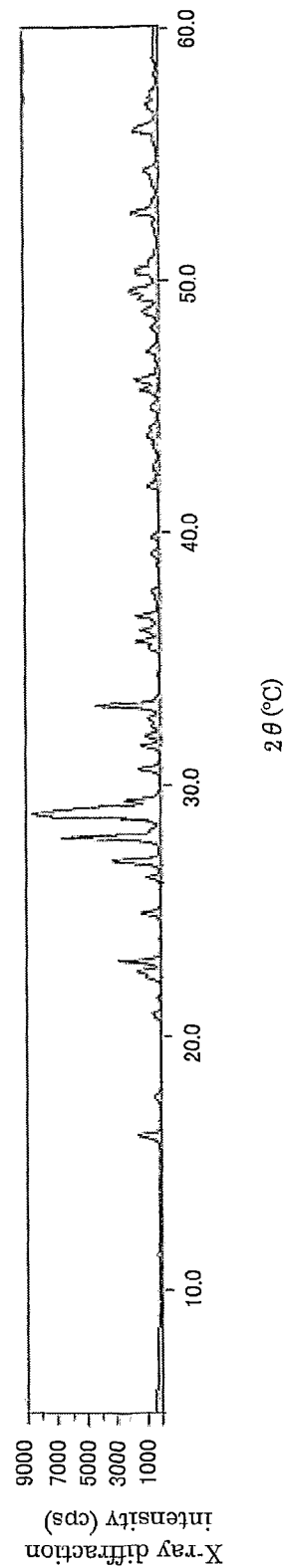
FIG. 3 shows an X-ray diffraction spectrum (pattern) of the crystal structure of Sputtering Target 1.

The crystal structure of Sputtering Target 1 was analyzed by X-ray diffraction. Diffraction peaks of the resultant X-ray diffraction pattern (FIG. 3) were collated with data of ICDD card so as to identify a crystal structure making up the target. As a result, it was found that Sputtering Target 1 contained a crystal structure of $Bi_{12}GeO_{20}$, $Bi_4B_2O_9$ and $Bi_2O_3$. That is, Sputtering Target 1 contained $Bi_4B_2O_9$ which was a composite oxide of Bi and B, and $Bi_{12}GeO_{20}$ which was a composite oxide of Bi and Ge.

The ICDD card (International Center for Diffraction Data card) is a standard data for X-ray powder diffraction, in which standard diffraction values of NBS (National Bureau of Standards) are added to an ASTM (American Society of Testing Materials) card, and formerly called as a JCPDS (Joint Committee of Powder Diffraction Standards) card.

Example 15

—Production of Sputtering Target 2—

Powders of $Bi_2O_3$, $B_2O_3$ and $GeO_2$ were weighed in a condition that they were free from water absorption, and then mixed so that the atomic ratio Bi:B:Ge was 65:30:5, followed by dry-mixing in a ball mill for 1 hour. The resultant powder mixture was calcined at 450° C. for 1 hour, dry-mixed and pulverized in a ball mill for 1 hour, and then molded under a pressure of 100 MPa to 200 MPa, heated up at a rate of temperature rise of 50° C./min., sintered at 650° C. for 5 hours in an atmosphere by hot pressing to prepare a sputtering target having a diameter of 200 mm and a thickness of 6 mm.

The target was then bonded to a backing plate made of oxygen-free copper by low-melting metal bonding to produce Sputtering Target 2. Sputtering Target 2 had a packing density of 84.6% and a composition of $Bi_{27.8}B_{12.7}Ge_{1.7}O_{57.8}$. The packing density was obtained in the same manner as in Example 14.

The crystal structure of Sputtering Target 2 was analyzed by X-ray diffraction. In the resultant X-ray diffraction pattern, the crystal structure making up the target was identified in the same manner as in Example 14, and it was found that the Sputtering Target 2 contained $Bi_4B_2O_9$, $Bi_2O_3$ and $GeO_2$.

Example 16

—Production of Sputtering Target 3—

Powders of $Bi_2O_3$, $B_2O_3$ and $GeO_2$ were weighed in a condition that they were free from water absorption, and then mixed so that the atomic ratio Bi:B:Ge was 65:25:10, followed by dry-mixing in a ball mill for 1 hour. The resultant powder mixture was calcined at 350° C. for 1 hour, dry-mixed and pulverized in a ball mill for 1 hour, and then molded under a pressure of 100 MPa to 200 MPa, heated up at a rate of temperature rise of 150° C./min., sintered at 650° C. for 3 hours in an atmosphere by hot pressing to prepare a sputtering target having a diameter of 200 mm and a thickness of 6 mm.

The target was then bonded to a backing plate made of oxygen-free copper by low-melting metal bonding to produce Sputtering Target 3. Sputtering Target 3 had a packing density of 69.0% and a composition of $Bi_{26.8}B_{10.4}Ge_{4.1}O_{58.7}$. The packing density was obtained in the same manner as in Example 14.

The crystal structure of Sputtering Target 3 was analyzed by X-ray diffraction. In the resultant X-ray diffraction pattern, the crystal structure making up the target was identified in the same manner as in Example 14, and it was found that the Sputtering Target 3 contained $Bi_2O_3$ and $GeO_2$ and $B_2O_3$.

Example 17

—Production of Sputtering Target 4—

Powders of $Bi_2O_3$, $B_2O_3$ and $GeO_2$ were weighed in a condition that they were free from water absorption, and then mixed so that the atomic ratio Bi:B:Ge was 70:25:5, followed by dry-mixing in a ball mill in an oxygen atmosphere for 1 hour. The resultant powder mixture was calcined in an oxygen atmosphere at 400° C. for 1 hour, dry-mixed and pulverized in a ball mill for 1 hour, and then molded under a pressure of 300 MPa, heated up to 780° C. at a rate of temperature rise of 50° C./min in an oxygen atmosphere under an oxygen flow, and sintered at 780° C. in a normal pressure for 8 hours to prepare a Sputtering Target 4 having a diameter of 200 mm and a thickness of 6 mm.

The target was then bonded to a backing plate made of oxygen-free copper by low-melting metal bonding to produce Sputtering Target 4. Sputtering Target 4 had a packing density of 86.0% and a composition of $Bi_{27.1}B_{10.4}Ge_{1.9}O_{60.6}$. The packing density was obtained in the same manner as in Example 14.

In the theoretical stoichiometric composition, the content of oxygen was 60.4 atomic % provided that Sputtering Target 4 contained $Bi_2O_3$, $GeO_2$ and $B_2O_3$. The difference between 60.6 atomic % and 60.4 atomic % was only an error range. Therefore, Sputtering Target 4 could be considered to have a stoichiometric composition.

Example 18

—Production of Sputtering Target 5—

Powders of Bi, B and Ge were weighed in a condition that they were free from water absorption, and then mixed so that the atomic ratio Bi:B:Ge was 65:30:5, followed by dry-mixing in a ball mill for 1 hour. The resultant powder mixture was mixed in an aqueous solution of polyvinyl alcohol, granulated, and then loaded in a mold made of carbon and sintered at 260° C. in vacuo under a pressure of 300 MPa for 10 hours by hot pressing to prepare a sputtering target having a diameter of 200 mm and a thickness of 6 mm.

The target was then bonded to a backing plate made of oxygen-free copper by low-melting metal bonding to produce Sputtering Target 5. Sputtering Target 5 had a packing density of 72.0% and a composition of $Bi_{65.1}B_{29.9}Ge_{5.0}$. The packing density was obtained in the same manner as in Example 14. The target 5 had a resistance of $1.3 \times 10^{-6}$ Ωm and could be direct-current sputtered.

A resistance was measured by a four-terminal method.

By contrast, Sputtering Target 1, 2, 3 and 4 had a resistance of 1 Ωm or more, and could not be direct-current sputtered.

Comparative Example 5

—Production of Sputtering Target 6—

Powders of $Bi_2O_3$ and $B_2O_3$ were weighed in a condition that they were free from water absorption, and then mixed that the atomic ratio Bi:B was 2:1, followed by dry-mixing in a ball mill for 1 hour. The resultant powder mixture was calcined at 350° C. for 1 hour, dry-mixed and pulverized in a ball mill for 1 hour, and then molded under a pressure of 100 MPa to 200 MPa, heated up at a rate of temperature rise of 150° C./min., sintered at 650° C. for 3 hours in an atmosphere by hot pressing to prepare a sputtering target having a diameter of 200 mm, and a thickness of 6 mm.

The target was then bonded to a backing plate made of lo oxygen-free copper by low-melting metal bonding to produce Sputtering Target 6. Sputtering Target 6 had a packing density of 74.0% and a composition of $Bi_{28.5}B_{14.3}O_{57.2}$. The packing density was obtained in the same manner as in Example 14.

<Comparison Between Sputtering Targets in Example 14 to 16 and that of Comparative Example 5>

The packing density and bending strength were compared among Sputtering Target 1 to 3 and 6. The bending strength was measured by means of a three point bending test in a condition that each of the sputtering targets was processed in a shape of 4 mm×40 mm×3 mm, a distance between supporting points of 30 mm, at room temperature and a test rate of 0.5 mm/min. The results are shown in Table 2.

TABLE 2

|  | Substances consist of a sputtering target | Packing density (%) | Bending strength (kgf/cm$^2$) |
| --- | --- | --- | --- |
| Sputtering Target 1 | $Bi_4B_2O_9$ $Bi_{12}GeO_{20}$ $Bi_2O_3$ | 94.0 | 360 |
| Sputtering Target 2 | $Bi_4B_2O_9$ $Bi_2O_3$ $GeO_2$ | 84.6 | 118 |
| Sputtering Target 3 | $Bi_2O_3$ $GeO_2$ $B_2O_3$ | 69.0 | 94 |
| Sputtering Target 4 | Not measured | 86.0 | 326 |

TABLE 2-continued

|  | Substances consist of a sputtering target | Packing density (%) | Bending strength (kgf/cm$^2$) |
|---|---|---|---|
| Sputtering Target 5 | Not measured | 72.0 | 464 |
| Sputtering Target 6 | Not measured | 74.0 | 38 |

As can be seen from the results of Table 2, the target containing Ge had high strength. Moreover, the target containing both of $Bi_4B_2O_9$ and $Bi_{12}GeO_{20}$ had still higher strength.

Example 19

<Comparison Between Sputtering Target 1 and Sputtering Target 4>

On a polycarbonate substrate provided with a groove (groove depth of 21 nm, track pitch of 0.32 µm) having a thickness of 1.1 mm and a diameter of 120 mm (product name: ST3000 by Teijin-Bayer Politec Ltd.), a reflective layer having a thickness of 60 nm and containing AgBi alloy (0.5 mass % of Bi), a SiN layer having a thickness of 4 nm, a first protective layer having a thickness of 15 nm and containing ZnS and $SiO_2$ where $ZnS:SiO_2$=80:20 (mole %), a recording layer having a thickness of 16 nm and containing Bi—B—Ge—O, and a second protective layer having a thickness of 75 nm and containing ZnS and $SiO_2$ where $ZnS:SiO_2$=80:20 (mole %) were formed in this order by sputtering by means of the same apparatus and condition as in Example 1.

Further, a polycarbonate sheet (PURE-ACE by Teijin Chemicals Ltd.) having a thickness of 75 µm was bonded on the second protective layer using an ultraviolet curable resin (DVD003 by Nippon Kayaku Co., Ltd.) so as to form a cover layer (optically transparent layer), thereby yielding a write-once-read-many optical recording medium having a thickness of approximately 1.2 mm.

The recording layer was formed by using Sputtering Target 1 and 4.

The write-once-read-many optical recording medium was evaluated for optimum recording power (mW) and a jitter (%) using an optical disc drive evaluation device ODU-1000 manufactured by Pulstec Industrial Co., Ltd. (wavelength of 405nm, numerical aperture NA of 0.85) by performing recording at a linear velocity of 4 times the linear velocity (1×) used for a write-once-read-many Blu-ray disc standard (BD-R Version 1.1). The write-once-read-many optical recording medium had a recording density the same as that of the write-once-read-many Blu-ray disc standard (BD-R Version 1.1). The results are shown in Table 3.

TABLE 3

|  | Optimum recording power (mW) | Jitter (%) | Layer deposition rate (in case that Sputtering Target 1 is defined as 1) |
|---|---|---|---|
| Sputtering Target 1 used for forming the recording layer | 7.7 | 5.5 | 1 |
| Sputtering Target 4 used for forming the recording layer | 8.9 | 6.0 | 0.8 |

As can be seen from the results of Table 3, use of Sputtering Target 1 for forming the recording layer could obtain relatively better recording sensitivity (lower optimum recording power), lower jitter value, and 20% faster layer deposition than use of Sputtering Target 4 for forming the recording layer.

Example 20

Powders of $Bi_2O_3$, $B_2O_3$ and $SnO_2$ were weighed in a condition that they were free from water absorption, and then mixed so that the atomic ratio Bi:B:Sn was 65:30:5, followed by dry-mixing in a ball mill for 1 hour. The resultant powder mixture was calcined at 500° C. for 1 hour, dry-mixed and pulverized in a ball mill for 1 hour, and then molded under a pressure of 100 MPa to 200 MPa, sintered at 650° C. for 5 hours in an atmosphere by hot pressing to prepare a sputtering target having a diameter of 200 mm and a thickness of 6 mm.

The target was then bonded to a backing plate made of oxygen-free copper by low-melting metal bonding to produce a sputtering target. The sputtering target had a packing density of 83.0% and a composition of $Bi27.5B_{12.7}Sn_{2.1}O_{57.7}$. The target had a bending strength of 214 kgf/cm$^2$ as a result of a three point bending test performed in the same manner as in Table 2. The packing density was obtained in the same manner as in Example 14.

Example 21

Powders of $Bi_2O_3$, $B_2O_3$ and ZnO were weighed in a condition that they were free from water absorption, and then mixed so that the atomic ratio Bi:B:Zn was 65:30:5, followed by dry-mixing in a ball mill for 1 hour. The resultant powder mixture was calcined at 500° C. for 1 hour, dry-mixed and pulverized in a ball mill for 1 hour, and then molded under a pressure of 100 MPa to 200 MPa, sintered at 650° C. in an atmosphere by hot pressing to prepare a sputtering target having a diameter of 200 mm and a thickness of 6 mm.

The target was then bonded to a backing plate made of oxygen-free copper by low-melting metal bonding to produce a sputtering target. The sputtering target had a packing density of 90.0% and a composition of $Bi_{28.2}B_{13.1}Zn_{2.1}O_{56.6}$. The target had a bending strength of 393 kgf/cm$^2$ as a result of a three point bending test performed in the same manner as in Table 2. The sputtering target containing Zn remarkably improved the strength of the sputtering target. The packing density was obtained in the same manner as in Example 14.

Example 22

Powders of $Bi_2O_3$, $B_2O_3$ and an oxide X (where X is Ge, Zn or Fe) were weighed in a condition that they were free from water absorption, and then mixed so as to be a desired atomic ratio of Bi:B:X, followed by dry-mixing in a ball mill for 1 hour. The resultant powder mixture was calcined at 380° C. in an atmosphere, mixed, pulverized and granulated in polyvinyl alcohol, and then molded under a pressure of 250 MPa, heated up at a rate of temperature rise of 50° C./min., sintered at 650° C. for 5 hours in an atmosphere and normal pressure to prepare sputtering targets having a diameter of 200 mm and a thickness of 6 mm.

Each of these targets was bonded to a backing plate made of oxygen-free copper by low-melting metal bonding to produce sputtering targets.

Write-once-read-many optical recording media were prepared and evaluated for an optimum recording power (mW) in the same manner as in Example 19, except that a recording layer was formed by using each of these targets and sputtering target in Example 20, and that an ultraviolet curable resin (KAYARAD BRD-807 by Nippon Kayaku Co., is Ltd.) was coated on a polycarbonate substrate having a thickness of 1.1 mm (Iupilon H-4000 by Mitsubishi Engineering-Plastics Corporation) by spin coating so as to form a cover layer having a thickness of 0.1 mm. The results and melting point of respective targets are shown in Table 4 and FIG. 4.

Note that the compositions of the targets were shown only by a ratio among Bi:B:X (atomic %). The oxygen made up approximately 55 atomic % to 62 atomic % of the entire target, and smaller than a stoichiometric composition. Because the oxygen content changed depending on combinations of elements, it was not simply compared. Therefore, the oxygen content was represented by $O_x$.

TABLE 4

| Target | Melting point (° C.) | Optimum recording power (mW) |
|---|---|---|
| $Bi_{65}B_{30}Zn_5O_x$ | 599.2 | 7.8 |
| $Bi_{65}B_{30}Fe_5O_x$ | 620.3 | 8.4 |
| $Bi_{80}B_{15}Ge_5O_x$ | 620.6 | 8.5 |
| $Bi_{65}B_{25}Ge_{10}O_x$ | 652.4 | 8.8 |
| $Bi_{65}B_{30}Ge_5O_x$ | 651.8 | 8.6 |
| $Bi_{65}B_{30}Sn_5O_x$ | 673.1 | 9.8 |

Figure 4:
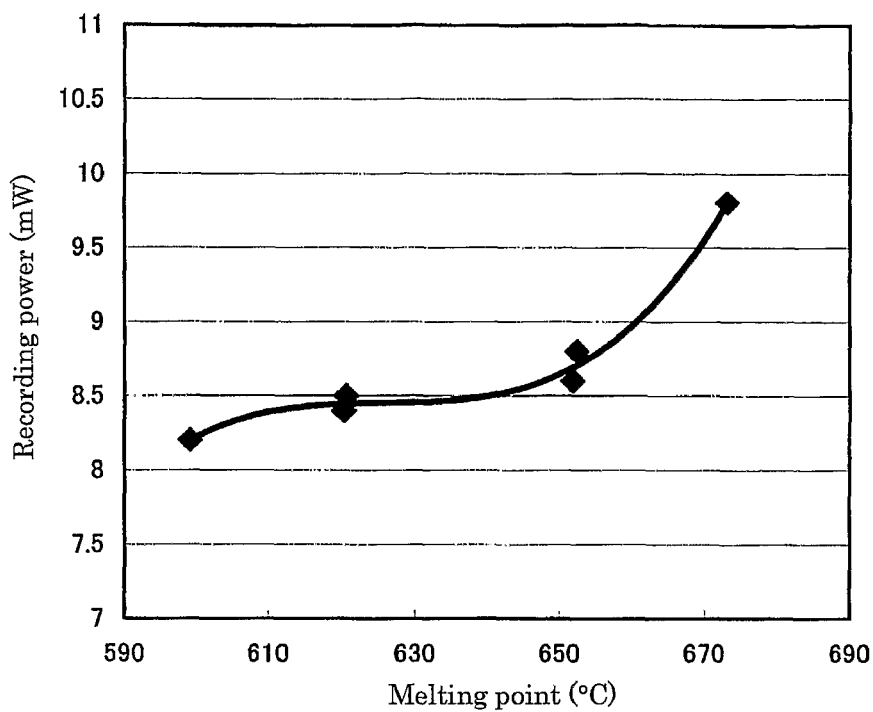
FIG. 4 shows results of Example 22.

As can be seen from the results of Table 4 and FIG. 4, the optimum recording power (recording sensitivity) increased with increasing the elevation of the melting point. Therefore, the melting point was preferably approximately 650° C. or less.

Example 23

Sputtering targets having respective packing density shown in Table 5 were produced in the same manner as in Example 14, except that the temperature and time of calcining were changed.

Write-once-read-many optical recording media were produced in the same manner as in Example 19, and evaluated by performing recording using the same apparatus and in the same condition as in Example 19, except that a recording layer was formed by using each of the targets shown in Table 5, and that an ultraviolet curable resin (KAYARAD BRD-807 by Nippon Kayaku Co., Ltd.) was coated on a polycarbonate substrate having a thickness of 1.1 mm (Iupilon H-4000 by Mitsubishi Engineering-Plastics Corporation) by spin coating so as to form a cover layer having a thickness of 0.1 mm.

The recording sensitivity (optimum recording power and recording power margin) and productivity were evaluated. The results are shown in Table 5.

The evaluation criteria for the recoding sensitivity were defined as follows:

A: the optimum recording power was 10.5 mW or less, and the recording power margin was 0.2 or more.

B: the optimum recording power was less than 10.5 mW, and the recording power margin was less than 0.2.

The evaluation criteria for the productivity were defined as follows:

A: the recording layer could be formed within 5 minutes and no crack was generated in the target.

B: the recording layer could not be formed within 5 minutes, or even though the recording layer could be formed within 5 minutes cracks were generated in the target.

TABLE 5

| Packing density (%) | Recording sensitivity | Productivity |
|---|---|---|
| 69 | A | B |
| 74.6 | A | A |
| 88.2 | A | A |
| 94.3 | A | A |
| 98.9 | A | A |
| 99.3 | B | A |

The evaluation criteria for the recoding sensitivity were defined as follows:
A: the optimum recording power was 10.5 mW or less, and the recording power margin was 0.2 or more.
B: the optimum recording power was less than 10.5 mW, and the recording power margin was less than 0.2.
The evaluation criteria for the productivity were defined as follows:
A: the recording layer could be formed within 5 minutes and no crack was generated in the target.
B: the recording layer could not be formed within 5 minutes, or even though the recording layer could be formed within 5 minutes cracks were generated in the target.

As can be seen from the results of Table 5, the higher packing density the target had, the lower the recording sensitivity became. When a target had a packing density of approximately 99% or more, the recording power margin was decreased. Therefore, a target preferably had a packing density of approximately 99% or less. By contrast, when a target had low packing density, cracks easily occurred in the target and productivity decreased, for example the layer deposition rate was reduced. Regarding productivity, it was found that a target having high packing density was preferable, because the layer deposition rate was increased and target had higher strength.

Therefore, the packing density was preferably approximately 75% to 99%.

It was also found that the packing density and the recording sensitivity were correlated. The packing density and the recording sensitivity are not generally correlated in a phase change material used for the recording layer in an optical recording medium. The correlation between the packing density and the recording sensitivity is inherent phenomenon in the material of the recording layer in the present invention, and this is a new findings as a result of consideration by the inventors of the present invention.

Industrial Applicability

An optical recording medium of the present invention enables to be recorded with high sensitivity over a wavelength range for blue laser, and correspond to high linear velocity recording, particularly suitable for a write-once-read-many optical recording medium.

A sputtering target and a method for producing the sputtering target of the present invention enable to improve layer deposition rate for improving productivity, strength during layer deposition and packing density, and are preferably used for producing the optical recording medium of the present invention.

The invention claimed is:

1. An optical recording medium comprising:
a substrate; and
a recording layer over the substrate,
wherein the recording layer primarily comprises Bi and O, and further comprises B and at least one element X selected from Ge, Li, Sn, Cu, Fe, Pd, Zn, Mg, Nd, Mn and Ni.

2. The optical recording medium according to claim 1, wherein the recording layer comprises Bi, B, O and Ge.

3. The optical recording medium according to claim 1, wherein the recording layer comprises Bi, B, O and Sn.

4. The optical recording medium according to claim 1, further comprising a first protective layer and a second protective layer, wherein the first protective layer is disposed on one surface of the recording layer and the second protective layer is disposed on the other surface of the recording layer.

5. The optical recording medium according to claim 4, wherein each of the first protective layer and the second protective layer comprises a sulfide, oxide, nitride, carbide or composite thereof.

6. The optical recording medium according to claim 4, wherein at least one of the first protective layer and the second protective layer comprises the sulfide.

7. The optical recording medium according to claim 6, wherein at least one of the first protective layer and the second protective layer comprises ZnS and $SiO_2$.

8. The optical recording medium according to claim 6, wherein at least a reflective layer, the first protective layer, the recording layer, and the second protective layer, and a cover layer are disposed over the substrate in this order.

9. The optical recording medium according to claim 6, wherein at least the second protective layer, the recording layer, the first protective layer and a reflective layer are disposed over the substrate in this order.

10. A sputtering target comprising Bi, B and at least one element X selected from Ge, Li, Sn, Cu, Fe, Pd, Zn, Mg, Nd, Mn and Ni.

11. The sputtering target according to claim 10, further comprising O, wherein the sputtering target primarily comprises Bi and O.

12. The sputtering target according to claim 11, wherein the sputtering target comprises Bi, B, O and Ge.

13. The sputtering target according to claim 11, wherein the sputtering target comprises Bi, B, O and Sn.

14. The sputtering target according to claim 11, wherein the sputtering target comprises a composite oxide of Bi and B, and the element X is at least one element selected from Ge, Sn, Cu, Pd, Zn, Nd, Mn and Ni.

15. The sputtering target according to claim 11, wherein the sputtering target comprises a composite oxide of Bi and the element X, and the element X is at least one element selected from Ge, Sn, Cu, Pd, Zn, Nd, Mn and Ni.

16. The sputtering target according to claim 15, wherein the sputtering target comprises $Bi_{12}GeO_{20}$.

17. The sputtering target according to claim 11, wherein the sputtering target comprises Bi and O, and further comprises B and at least one element X selected from Ge, Sn, Cu, Pd, Zn, Nd, Mn and Ni, which are contained as an oxide, and the oxide contains oxygen smaller than the stoichiometric composition.

18. The sputtering target according to claim 10, wherein the sputtering target has a packing density of 75% to 99%, and the element X is at least one element selected from Ge, Sn, Cu, Pd, Zn, Nd, Mn and Ni.

19. A method for producing a sputtering target comprising:
mixing, pulverizing and granulating a powder of $Bi_2O_3$, a powder of $B_2O_3$ and a powder of at least one element X selected from Ge, Li, Sn, Cu, Fe, Pd, Zn, Mg, Nd, Mn and Ni in a condition that they are free from water absorption so as to form granulated powders; and
sintering the granulated powders by heating and pressing, wherein the sputtering target comprises Bi, B and at least one element X selected from Ge, Li, Sn, Cu, Fe, Pd, Zn, Mg, Nd, Mn and Ni.

20. A method for producing a sputtering target comprising:
mixing a powder of $Bi_2O_3$, a powder of $B_2O_3$ and a powder of at least one element X selected from Ge, Sn, Cu, Pd, Zn, Nd, Mn and Ni in a condition that they are free from water absorption so as to form mixed powders;
pulverizing and granulating the mixed powders at a temperature between the melting point of $B_2O_3$ and the melting point of $Bi_2O_3$ so as to form granulated powders;
molding the granulated powders by heating and pressing so as to form a molded article; and
sintering the molded article without pressing,
wherein the sputtering target comprises Bi, B and at least one element X selected from Ge, Sn, Cu, Pd, Zn, Nd, Mn and Ni.

* * * * *